United States Patent [19]

Arimatsu

[11] 4,337,220
[45] Jun. 29, 1982

[54] PRODUCTION OF PHOTOSENSITIVE RESIN CYLINDERS

[75] Inventor: Seiji Arimatsu, Osaka, Japan

[73] Assignee: Nippon Paint Co., Ltd., Osaka, Japan

[21] Appl. No.: 203,888

[22] Filed: Nov. 4, 1980

Related U.S. Application Data

[63] Continuation of Ser. No. 24,040, Mar. 26, 1979, abandoned.

[30] Foreign Application Priority Data

Mar. 29, 1978 [JP] Japan .................................. 53-37084

[51] Int. Cl.³ .............................................. B29C 27/02
[52] U.S. Cl. ...................................... 264/25; 156/187; 156/192; 264/248; 264/310; 264/DIG. 68; 430/130; 430/133; 430/300; 430/306
[58] Field of Search ....... 264/248, DIG. 41, DIG. 67, 264/DIG. 68, 310, 25, 36, 229, 230, 249; 425/302.1, 363, 373, 383, 394, 402; 156/185, 187, 192; 430/300, 306, 130, 133

[56] References Cited

U.S. PATENT DOCUMENTS

| 1,985,997 | 1/1935 | Keeran | 264/248 |
| 2,225,026 | 12/1940 | Welsh | 156/192 |
| 2,960,425 | 11/1960 | Sherman | 156/187 |
| 3,030,696 | 4/1962 | Serwer | 156/187 |
| 3,225,129 | 12/1965 | Taylor et al. | 264/230 |
| 4,178,200 | 12/1979 | Hakert et al. | 156/187 |

Primary Examiner—James B. Lowe
Attorney, Agent, or Firm—Wenderoth, Lind & Ponack

[57] ABSTRACT

A process for preparing photosensitive resin cylinders which comprises winding a photosensitive resin sheet on and around the surface of a cylinder without any material overlapping of or spaces between the edge portions of the wound resin sheet, and applying to the cylinder under rotation a roll rotating in contact with the surface of the resin sheet while heating so as to join the edge portions of the resin sheet to one another by melting and to make uniform the thickness of the resin sheet.

5 Claims, 4 Drawing Figures

PRODUCTION OF PHOTOSENSITIVE RESIN CYLINDERS

This is a continuation of application Ser. No. 24,040, filed Mar. 26, 1979, now abandoned.

BACKGROUND OF THE INVENTION

The present invention relates to production of photosensitive resin cylinders.

Photosensitive resin cylinders comprising a cylinder and a photosensitive resin layer formed on and around the surface of the cylinder have been widely utilized as original cylinders for manufacture of endless, cylindrical resin plates such as resin gravure cylinders and resin relief cylinders. Such photosensitive resin cylinders are usually prepared by applying a photosensitive resin solution to the surface of a cylinder by spraying or coating and then drying the applied surface. Although this method is highly effective when the thickness of the photosensitive resin layer is relatively small as in the case of photosensitive resin gravure original cylinders, problems arise when the thickness is large. In the case of preparing a photosensitive resin cylinder having a photosensitive resin layer of 3 mm in thickness, for instance, it is inevitably necessary to effect repeated coating operations for formation of the photosensitive resin layer, which is troublesome in itself. In addition, a long time is required for drying due to such large thickness.

SUMMARY OF THE INVENTION

A main object of the present invention is to provide a process for preparing easily and quickly photosensitive resin cylinders having a photosensitive resin layer of relatively large thickness (e.g. 1 to 4 mm). Another object of this invention is to provide an apparatus for realization of such process. These and other objects of the invention will become apparent to those skilled in the art from the foregoing and subsequent descriptions.

The process of this invention comprises winding a photosensitive resin sheet on and around the surface of a cylinder, preferably with the intervention of an adhesive layer between the resin sheet and the cylinder, without any material overlapping of or space between the edge portions of the wound resin sheet and applying to the cylinder under rotation a roll rotating in contact with the surface of the resin sheet while heating so as to join the edge portions of the resin sheet to one another by melting and to make uniform the thickness of the resin sheet, whereby a photosensitive resin cylinder is obtained.

The apparatus of the invention for realizing the process comprises a cylinder on and around which a photosensitive resin sheet is to be wound, a means for supporting the cylinder horizontally in a rotatable state, a driving means for rotating the cylinder, a heating means for softening the resin sheet, a roll positioned in parallel to the cylinder and a means for supporting the roll in a rotatable state and for optionally moving the roll toward or away from the cylinder.

BRIEF DESCRIPTION OF THE DRAWINGS

The present invention will be hereinafter explained in detail with reference to the accompanying drawings wherein.

DETAILED DESCRIPTION OF THE INVENTION

Figure 1:
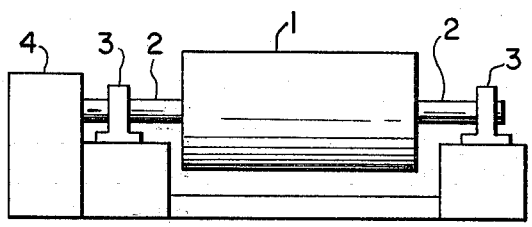
FIG. 1 shows a front view of an embodiment of the apparatus according to the present invention.
Figure 2:
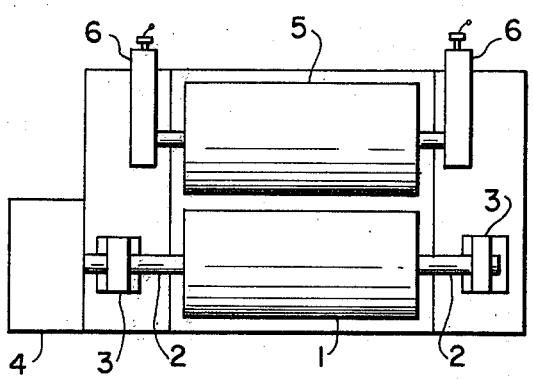
FIG. 2 shows a plan view of the embodiment shown in FIG. 1.

In the apparatus as shown in FIGS. 1 and 2, the numeral 1 represents a cylinder on and around which a photosensitive resin sheet is to be wound, and an axle or axis 2 is fixed to cylinder 1. The numeral 3 indicates bearings which support the cylinder 1 in a horizontal state, optional fitting and removal of the cylinder 1 being possible. At the left end of the axis 2 is attached a gear (not shown) through which rotary power is transferred from a driving source 4 to the cylinder 1. The numeral 5 represents a roll whose surface is preferably finished with chromium plating or Teflon processing so as to avoid attachment thereto of the photosensitive resin softened by heating. Elements 6 contain a pillow block (not shown) supporting the roll 5, such that the pillow block and roll 5 are capable of approaching to or going away from the cylinder 1. After the distance between the cylinder 1 and the roll 5 is adjusted, the pillow block is fixed so that the distance is not changed during operation. At the upper portion of the cylinder 1 is positioned, a heating means for softening the photosensitive resin sheet, such as an infrared heater (not shown). In place of using such an exterior heating means, a so-called heat roll containing in the interior thereof a heating mechanism may be employed as the roll 5 for simplifying the apparatus and improving the heat efficiency.

In the above apparatus, the cylinder 1 and the roll 5 may be located parallel in the horizontal direction as shown in FIG. 2, or alternatively in the vertical direction. When arranged in the vertical direction, the cylinder 1 may be positioned above the roll 5 or vice versa. The roll 5 will usually be mounted for free rotation, but compulsory driving in connection with the rotation of the cylinder 1 is also possible. As to the driving mechanism of the cylinder 1, the use of such mechanism is not always required, but any such mechanism which can rotate and drive the cylinder may be adopted. Similarly, the mechanism for regulation of the distance between the cylinder 1 and the roll 5 is not restricted to the arrangement described above, but any other mechanism which can permit the roll 5 to be moved toward or away from the cylinder 1 may be used. Besides, it is possible to alter and modify the apparatus of the invention depending on the length and the diameter of the cylinder.

The concrete procedure for preparing the photosensitive resin cylinder by the use of the apparatus as shown in FIGS. 1 and 2 will be hereinafter explained in detail.

(1) Firstly, the cylinder 1 is set up to a designed position of the apparatus. Then, a tape having adhesive layers on both surfaces is stuck onto the surface of the cylinder. The purpose of the use of the adhesive tape is to adhere a photosensitive resin sheet onto the cylinder 1. In place of using the adhesive tape, a suitable adhesive agent may be applied. Further, any cushioning material as conventionally employed in flexo printing may be provided between the photosensitive resin sheet and the cylinder.

Figure 3:
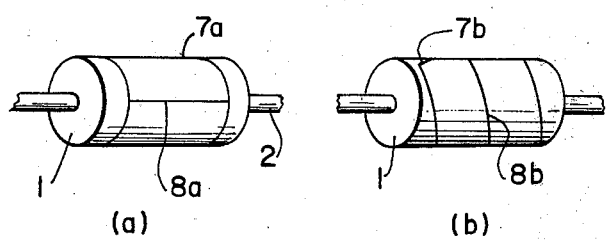
FIGS. 3(a) and 3(b) show respectively perspective views of embodiments representing the status of a photosensitive resin sheet wound on and around a cylinder.
Figure 4:
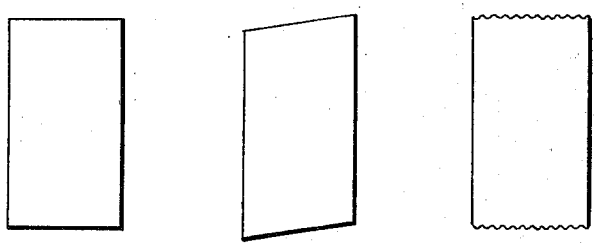
FIGS. 4(a) to 4(c) show respectively plan views of embodiments of a photosensitive resin sheet to be wound on and around a cylinder.

(2) Then, the distance or gap between the cylinder 1 and the roll 5 is adjusted to a value substantially the same as that of the thickness of the photosensitive resin sheet, and the photosensitive resin sheet is wound on and around the surface of the cylinder 1 which is slowly rotated without overlapping of or spaces between the edge portions of the wound sheet. An example of the state of the wound photosensitive resin sheet is shown in FIG. 3(a) wherein a photosensitive resin sheet 7a having a designed size (width and length) (FIG. 4(a)) is wound so that its terminal ends or edges are parallel with the direction of the axis 2 of the cylinder 1 and so that neither overlapping nor a space is produced at the joint 8a of the terminal ends or edges. In this case, the photosensitive resin sheet is not always required to have a rectangular form as shown in FIG. 4(a), but a parallelogramic form as shown in FIG. 4(b) or a form having notched ends as shown in FIG. 4(c) may be also adopted.

Another example of the state of the wound photosensitive resin sheet is shown in FIG. 3(b). The photosensitive resin sheet in a band form 7b is wound spirally without overlapping or spaces at the joint 8b of the two side ends or edges. By the use of the sheet in a band form, it is not necessary to make a measurement of the length of the peripheral surface of the cylinder 1. In this case, the excessive portions of the sheet at the end or ends of the cylinder may be cut off by a conventional procedure after heating and softening at a subsequent step.

The winding of the photosensitive resin sheet may be effected by manual operation, or by the aid of any mechanical apparatus. Further, it is preferred that the resin sheet be kept on a supporter having good size stability (e.g., a polyester sheet) prior to winding. Furthermore, in the case of the photosensitive resin sheet being in a band form, the sheet may be kept in a wound up state on a roll with the intervention of a releasing device before winding.

(3) The cylinder 1 is further rotated slowly while heating the resin sheet by an infrared heater radiating in a single direction. The rotating speed of the cylinder 1 is usually desired to be such that softening of the joint can be realized, i.e. 100 cm/min. or less, preferably 25 to 75 cm/min. (peripheral velocity). The infrared heater is only required to afford an amount of heat sufficient for softening the resin sheet, and excessive heating which causes flowing of the resin should be avoided, because the flowing resin adheres to the roll 5 or hangs down to make the control of the film thickness difficult. The electric power of the infrared heater and the irradiation distance should be varied depending on the softening temperature of the resin and the rotating speed of the cylinder 1. For instance, in the case of the photosensitive resin having a softening temperature of 60° C., as shown in the below-mentioned working example, heating and softening of the resin can be sufficiently attained with irradiation by the aid of an infrared heater of 900 W at a distance of 2.5 cm for 10 minutes when the peripheral velocity of the cylinder 1 is 55 cm/min. In this manner, the edge portions of the resin sheet on the cylinder 1 are combined by melting to make the joint disappear, and the thickness of the sheet becomes uniform. After the melt-joining of the resin sheet, the operation of the heater is stopped, and the rotation of the cylinder 1 is further continued until the resin sheet on the cylinder 1 is cooled to room temperature, whereby an objective photosensitive resin cylinder can be obtaind.

According to the process of the invention, photosensitive resin cylinders can be manufactured easily and quickly with photosensitive resin sheets in a solid form. Besides, the resin cylinder obtained according to the invention can as such be subjected to production to form printing cylinders. This is extremely advantageous with respect to the retention of precision which is required in printing.

The present invention will be hereinafter explained in further detail by the following Example.

EXAMPLE 1

In the apparatus of the invention as shown in FIGS. 1 and 2, an iron cylinder (circumference, 550 mm) fittable to a flexographic printing machine is first set up, and a tape having adhesive layers on both surfaces ("Nitto Both Surface Adhesive Tape" manufactured by Nitto Denki Kogyo; thickness, 0.13 mm) is stuck on the surface of the cylinder (about 2 minutes).

Then, a photosensitive resin sheet ("Nippe Runaflex S-25" manufactured by Nippon Paint Co., Ltd.; thickness, 2.5 mm) is cut to a length of 550.8 mm (about 4 minutes) and wound on and around the adhesive tape on the cylinder (about 2 minutes). The distance between the cylinder and the roll at this time is 2.5 mm.

The cylinder is rotated at a rate of 1 rpm under irradiation of infrared rays from a distance of 2.5 cm by an infrared heater of 900 W. After the rotation of the cylinder for 10 minutes, the joint of the resin sheet disappears, and a resin layer is formed uniformly on the cylinder. The operation of the infrared heater is stopped, and the rotation of the cylinder is continued until the resin layer is cooled to room temperature (about 2 minutes). Then, the roll is moved away from the cylinder, and the cylinder is removed, whereby a photosensitive resin cylinder having a resin layer of 2.5 mm in thickness is obtained. The total working time is about 20 minutes. Since the thickness of the adhesive tape is absorbed into the resin (rubber), the above mentioned thickness (2.5 mm) includes the thickness of the adhesive tape (0.13 mm).

What is claimed is:

1. A process for producing a photosensitive resin cylinder of the type including a cylinder having applied to the surface thereof a smooth and uniform thickness layer of photosensitive resin material, said process comprising:
winding a photosensitive resin sheet having a thickness of from 1 to 4 mm on and around the surface of a cylinder without allowing any material overlapping of or spaces between the side edge portions of the thus wound sheet;
rotating said cylinder with said wound sheet thereon while contacting the surface of said wound sheet with a roll and causing said roll to rotate against said surface, and simultaneously applying heat in a single direction from an external infrared heater to said wound sheet, thereby joining said side edge portions of said wound sheet by melting, the amount of heat thus applied being sufficient to soften said wound sheet without causing said resin material to flow; and
continuing said rotation of said cylinder while cooling said wound sheet, thus forming said wound sheet into a photosensitive resin layer having a uniform thickness of from 1 to 4 mm and a smooth outer surface.

2. A process as claimed in claim 1, further comprising adhering said wound sheet onto said cylinder by interposing an adhesive therebetween.

3. A process as claimed in claim 2, wherein said interposing comprises applying to said cylinder a tape having on opposite surfaces thereof adhesive, and wherein said photosensitive resin sheet is then wound over said tape.

4. A process as claimed in claim 1, wherein said photosensitive resin sheet is wound around said cylinder in a direction circumferentially thereof.

5. A process as claimed in claim 1, wherein said photosensitive resin sheet is spirally wound around said cylinder.

* * * * *